(12) United States Patent
Adetutu et al.

(10) Patent No.: US 8,435,898 B2
(45) Date of Patent: May 7, 2013

(54) FIRST INTER-LAYER DIELECTRIC STACK FOR NON-VOLATILE MEMORY

(75) Inventors: Olubunmi O. Adetutu, Austin, TX (US); Christopher B. Hundley, Georgetown, TX (US); Paul A. Ingersoll, Austin, TX (US); Craig T. Swift, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 734 days.

(21) Appl. No.: 11/697,106

(22) Filed: Apr. 5, 2007

(65) Prior Publication Data

US 2008/0248649 A1 Oct. 9, 2008

(51) Int. Cl.
*H01L 21/4763* (2006.01)

(52) U.S. Cl.
USPC .............. 438/692; 257/E21.249; 257/758

(58) Field of Classification Search .............. 438/692; 257/E21.249, 758
See application file for complete search history.

(56) References Cited

U.S. PATENT DOCUMENTS

| | | | | |
|---|---|---|---|---|
| 5,518,962 | A * | 5/1996 | Murao | 438/624 |
| 5,611,888 | A * | 3/1997 | Bosch et al. | 438/724 |
| 5,783,482 | A * | 7/1998 | Lee et al. | 438/624 |
| 5,952,243 | A | 9/1999 | Forester et al. | 438/693 |
| 6,066,555 | A * | 5/2000 | Nulty et al. | 438/634 |
| 6,080,639 | A | 6/2000 | Huang et al. | |
| 6,191,050 | B1 | 2/2001 | Andideh | |
| 6,514,882 | B2 | 2/2003 | Mukai et al. | |
| 6,689,693 | B2 * | 2/2004 | Givens et al. | 438/692 |
| 6,734,108 | B1 | 5/2004 | Jin et al. | |
| 2002/0163080 | A1 * | 11/2002 | Taniguchi et al. | 257/758 |
| 2006/0008990 | A1 * | 1/2006 | Kwon | 438/258 |
| 2006/0051926 | A1 * | 3/2006 | Jeong et al. | 438/296 |
| 2006/0154460 | A1 * | 7/2006 | Yun et al. | 438/586 |
| 2006/0205219 | A1 * | 9/2006 | Baker et al. | 438/692 |

FOREIGN PATENT DOCUMENTS

| | | |
|---|---|---|
| JP | 06216096 A | 8/1994 |
| JP | 2000150637 A | 5/2000 |
| JP | 2003273098 A | 9/2003 |
| JP | 2004517467 A | 6/2004 |
| JP | 2006186012 A | 7/2006 |
| JP | 2006237082 A | 9/2006 |
| WO | 91/10261 A1 | 7/1991 |

OTHER PUBLICATIONS

Prado et al., "Microstructural modifications induced by rapid thermal annealing in plasma deposited SiONH films", Journal of Applied Physics, vol. 94, No. 2, Jul. 15, 2003, pp. 1019-1029.*
PCT Search report and Written Opinion for corresponding PCT Application No. PCT/US08/56562 mailed Jun. 25, 2008.
J. Goo et al., A Highly Manufacturable, Low-Thermal Budget, Void and Seam Free Pre-Metal-Dielectric Process Using New SOG for Beyond 60nm DRAM and Other Devices, IEEE International Electronic Device Manufacturers, session 12, paper 03, pp. 271-274 (Introduction), Dec. 2001.

* cited by examiner

*Primary Examiner* — Julio J Maldonado
*Assistant Examiner* — Sonya D McCall Shepard
(74) *Attorney, Agent, or Firm* — Hamilton & Terrile, LLP; Michael Rocco Cannatti (57) ABSTRACT

A method and apparatus are described for forming a first inter-layer dielectric (ILD0) stack having a protective gettering layer (72) with a substantially uniform thickness. After forming device components (32, 33) on a substrate (31), a gap fill dielectric layer of SATEOS (52) is deposited over an etch stop layer of PEN ESL (42) and then planarized before sequentially depositing a gettering layer of BPTEOS (72) and capping dielectric layer (82) on the planarized gap fill dielectric layer (52). Once the ILD0 stack is formed, one or more contact openings (92, 94, 96) are etched through the ILD0 stack, thereby exposing the etch stop layer (42) over the intended contact regions.

17 Claims, 5 Drawing Sheets

FIRST INTER-LAYER DIELECTRIC STACK FOR NON-VOLATILE MEMORY

BACKGROUND OF THE INVENTION

1. Field of the Invention

The present invention is directed in general to the field of semiconductor devices. In one aspect, the present invention relates to the fabrication of interlayer dielectric layers used in floating gate or other semiconductor device structures.

2. Description of the Related Art

Semiconductor devices typically include device components (such as transistors and capacitors) that are formed on or in a substrate as part of the front end of line (FEOL) processing. In addition, interconnect features (such as contacts, metal lines and vias) that connect the device components to the outside world are included as part of the back end of line (BEOL) integration process whereby one or more dielectric layers are formed in and between the interconnect features for purposes of electrically isolating the interconnect features and device components. To protect semiconductor devices from the charge loss/gain effects of mobile ions and other undesired impurities, the BEOL dielectric layers typically include a layer of boro-phosphorous tetra-ethyl ortho-silicate (BPTEOS) that forms all or part of the first inter-layer dielectric (ILD0), which is sometime also referred to as the pre-metal dielectric (PMD). For example, the BPTEOS layer provides a gettering function to help protect non-volatile memories (NVM) from the effects of mobile ions that can affect the data retention performance of the NVM cell(s). The BPTEOS layer can also help control the field leakage between semiconductor transistors, such as those formed in an array of transistors.

Figure 1:
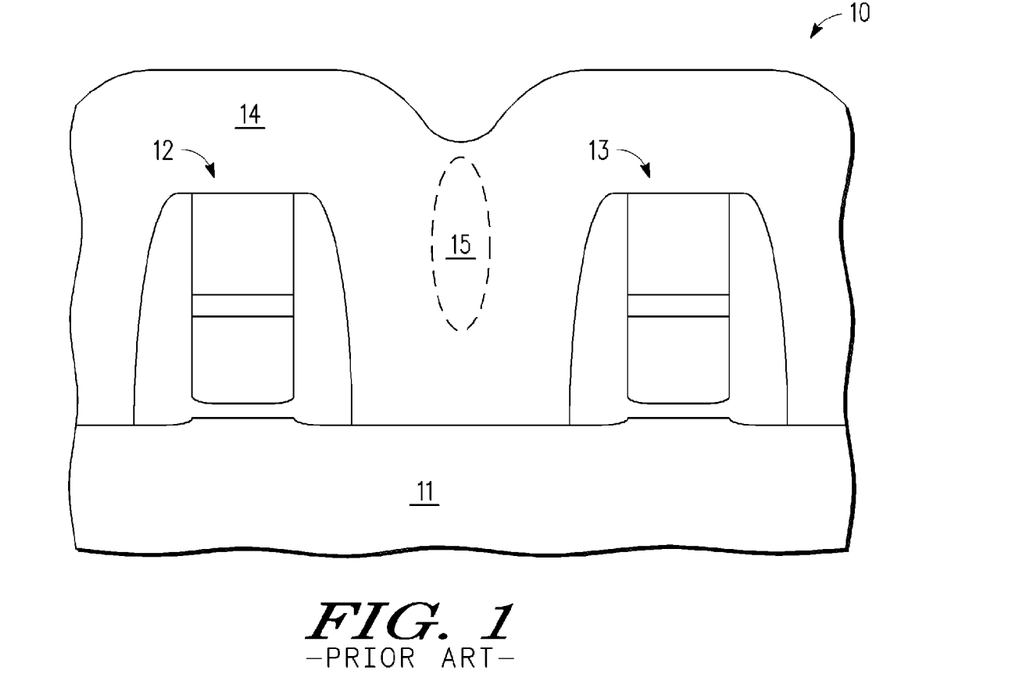
FIG. 1 is a partial cross-sectional view of a semiconductor device on which is formed a single layer BPTEOS layer having a void.

An example of such a semiconductor device is illustrated in FIG. 1, which depicts a semiconductor device 10 in which device components (such as transistors 12, 13) are formed on or in a substrate 11. The depicted device components 12, 13 shown in simplified schematic form can represent any type of transistor device (such as a MOSFET, DRAM or NVM device), and may be formed using any desired transistor fabrication sequence which forms a gate electrode and a gate dielectric layer over the substrate 11 and uses a sidewall spacer on the gate electrode to form at least part of the source/drain region(s) (not shown) in the substrate 11. With existing fabrication processes, the gettering layer is formed by depositing a BPTEOS layer 14 over the device components 12, 13. However, when deposited non-conformally, the BPTEOS layer 14 forms more thickly at the top of the device components 12, 13 and pinches off the opening, thereby forming a void region 15 in the BPTEOS layer 14. The presence of voids in the ILD0 layer can trap mobile ions that are generated in the course of subsequent processing steps, such as ions from chemical mechanical polish slurry materials used in subsequent polishing steps and from other processing and/or cleaning steps. The presence of mobile ions in the device can reduce device yield and impair performance, particularly with NVM devices. In addition, subsequent contact formation steps can create conductive stringers in the voids (e.g., tungsten stringers), thereby shorting two or more contacts together.

Figure 2:
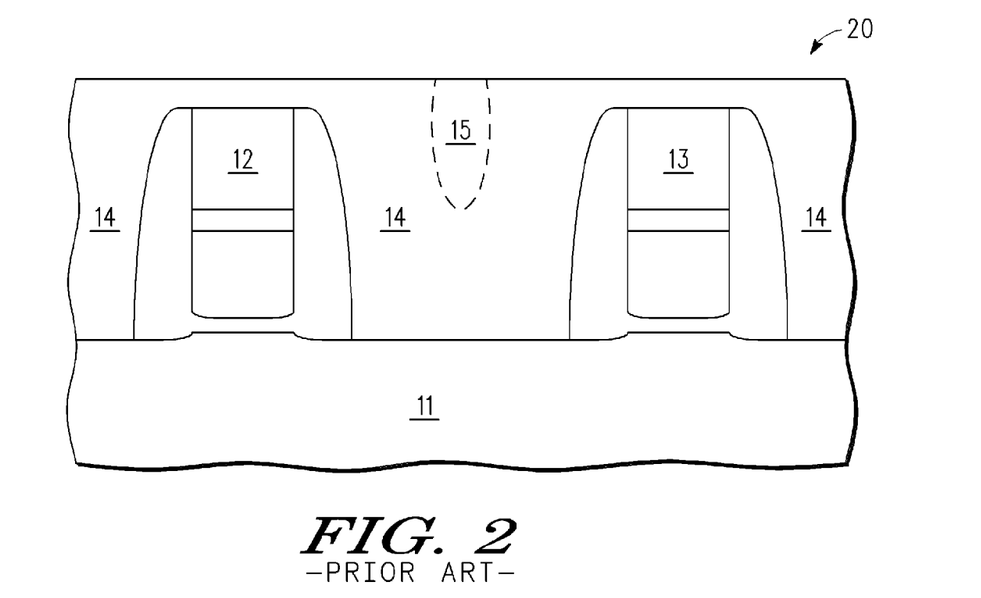
FIG. 2 illustrates processing subsequent to FIG. 1 after planarization of the BPTEOS layer.

In addition to introducing mobile ions, the subsequent polishing steps can also reduce or eliminate the protective function provided by the BPTEOS layer 14. This can occur during planarization of the ILD0 layer, when the BPTEOS layer 14 is part of a stack of films included in the ILD0 stack and is polished off to expose at least part of the underlying semiconductor device 20, as illustrated in FIG. 2. In particular, when a chemical mechanical polish (CMP) step is used to polish the BPTEOS layer 14, variations in the CMP polish rate (as between dense and isolated areas) can remove or thin the BPTEOS layer 14 in some areas, thereby removing the gettering protective function in those areas. Even where the polish removes only part of the BPTEOS layer 14, the remaining exposed BPTEOS layer can be exposed to impurities in the atmosphere which can be trapped in the BPTEOS layer, thereby reducing its gettering efficiency.

Accordingly, a need exists for an improved process for fabricating an ILD0 layer that is void-free. In addition, there is a need for a void-free ILD0 stack that provides full gettering protection and that can be effectively, efficiently and reliably integrated into the fabrication process, such as the middle of line process. There is also a need for an improved ILD0 stack formation process that will provide effective protection against mobile ions, improve device yield and/or reduce the formation of stringer shorts. There is also a need for an improved semiconductor processes and devices to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A method and apparatus are described for forming a first inter-layer dielectric (ILD0) on a semiconductor device where the ILD0 layer includes a protective gettering layer having a substantially uniform thickness. In a selected embodiment, the ILD0 layer is formed by depositing an etch stop layer (e.g., plasma-enhanced silicon nitride) over the semiconductor devices to protect the underlying gate stack during subsequent contact etch process(es) and to provide some protection against mobile ions. To address potential defects in the etch stop layer, such as seam lines that could provide paths for ion path migration, a more robust protection is required. In various embodiments, a robust gettering protection is provided in an ILD0 stack by first forming a gap fill layer over the etch stop layer to a thickness that completely covers the gates and overfills the regions between semiconductor devices so as to reduce or eliminate the formation of voids or cores. The gap fill layer may be formed by conformally depositing a dielectric layer of sub-atmospheric tetraethyl ortho silicate (SATEOS) or high density plasma (HDP) oxide, or by using any dielectric that completely fills the gaps. If the gap fill material has an undesirably high polish rate or cannot withstand CMP processing, a stable polish layer may be formed over the gap fill material using an appropriate dielectric material, such as phosphorous doped TEOS (PTEOS). After planarizing the gap fill layer or stack, a gettering layer is formed over the planarized gap fill layer or stack, such as by depositing a dielectric layer of BPTEOS, PTEOS or boron doped TEOS (BTEOS). In addition, an additional dielectric may be formed over the gettering layer by depositing a dense dielectric layer, such as plasma enhanced TEOS (PETEOS). The additional dielectric layer acts as a cap for the gettering film to protect the gettering film against exposure to atmospheric impurities during subsequent processing. The dense dielectric layer also provides structural support to anchor subsequently formed metal trenches (e.g., Cu), and may also provide a copper diffusion barrier function to prevent subsequently formed copper from diffusing through the ILD0 layer. In cases where the gap fill layer is formed with a high density plasma (HDP) dielectric film, there is less need for an additional dense dielectric layer, since the HDP layer provides the protective and structural support functions. In yet other embodiments, the gap fill layer may be formed with an HDP doped dielectric film (such as HDP BPTEOS or HDP PTEOS) and an optional polish cap layer, and then polished with a CMP process so that a subsequently deposited TEOS metal anchor cap layer may be formed on a planar surface. As will be appreciated, one or more of the gap fill layer, gettering layer and additional dielectric layer may optionally be densified with one or more anneal process steps. By disclosing a methodology for forming an integrated ILD0 stack wherein the gettering layer (and any additional dielectric layer) is formed after the ILD0 planarization step, the gettering film is formed on a planarized dielectric with good interface and has a substantially uniform thickness and that is not polished off or exposed. After the ILD0 stack layers are formed, contact openings are etched to expose the underlying semiconductor device(s), and then any desired back end of line processing, such as standard CMOS BEOL processing, may be used to complete the device. With the disclosed methodology and apparatus, voids in the ILD0 layer are reduced or eliminated and gettering protection is enhanced, thereby increasing manufacturing yield, particularly for NVM products with aggressive contact plug aspect ratio, though the disclosed techniques can be used for any product or technology where voids in the plug limits yield.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, it is noted that, throughout this detailed description, certain layers of materials will be deposited and removed to form the depicted semiconductor structures. Where the specific procedures for depositing or removing such layers are not detailed below, conventional techniques to one skilled in the art for depositing, removing or otherwise forming such layers at appropriate thicknesses shall be intended. Such details are well known and not considered necessary to teach one skilled in the art of how to make or use the present invention. In addition, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. It is also noted that, throughout this detailed description, certain elements in the figures are illustrated for simplicity and clarity and have not necessarily been drawn to scale. For example, the dimensions of some of the elements in the figures may be exaggerated relative to other elements to help improve the understanding of the embodiments of the present invention.

Figure 3:
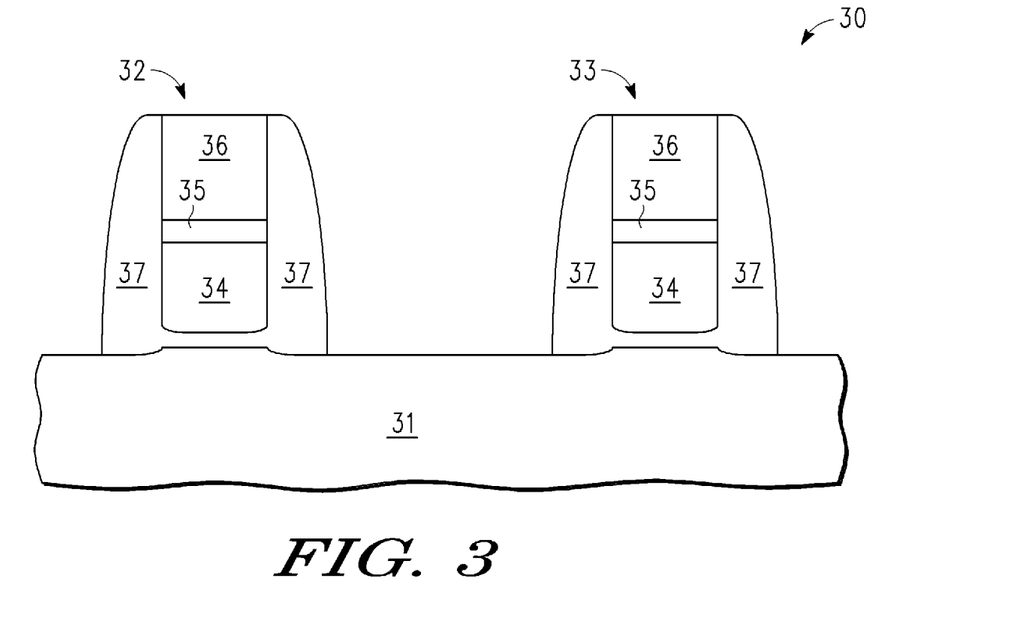
FIG. 3 is a partial cross-sectional view of a semiconductor device in which NVM device components are formed on a substrate.

Beginning with FIG. 3, a partial cross-sectional view is shown of a semiconductor device 30 in which transistor device components (such as MOS, NVM or DRAM devices) 32, 33 are formed on a substrate 31. Depending on the type of transistor devices 32, 33 being fabricated, the substrate 31 may be implemented as a bulk silicon substrate, single crystalline silicon (doped or undoped), or any semiconductor material including, for example, Si, SiC, SiGe, SiGeC, Ge, GaAs, InAs, InP as well as other Group III-IV compound semiconductors or any combination thereof, and may optionally be formed as the bulk handling wafer. In addition, the substrate 31 may be implemented as the top semiconductor layer of a semiconductor on-insulator (SOI) structure or a hybrid substrate comprised of bulk and/or SOI regions with differing crystal orientation.

In the simplified device example illustrated in FIG. 3, each of the device components 32, 33 is a non-volatile memory (NVM) device having a channel region over which is formed an NVM gate stack which includes a first insulating or tunnel dielectric layer, a floating gate 34 formed over the first layer, a control dielectric layer(s) 35 (e.g., ONO layer) formed over the floating gate 34, and a control gate 36 formed over the dielectric layer 35. In addition, one or more sidewall spacers 37 formed on the side of the NVM gate stack 32, 33 are typically used in the formation of source and drain regions (not shown) in the substrate 31. Though the floating gates 34 are illustrated as being lifted on the edges from oxide encroachment, this is not a required feature of the present invention. In operation, the floating gate layer 34 acts as a charge storage layer that is charged under control of the control gate 36 and tunnel dielectric. In forming the device components 32, 33, any desired front end of line processing sequence may be used. As will be appreciated, there are other types of NVM devices besides floating gate devices, including nanocrystal devices and SONOS (silicon-oxide-nitride-oxide-silicon) devices. In addition, it will be appreciated that the device components can represent any type of semiconductor device component, such as a MOSFET transistor, double gate fully depleted semiconductor-on-insulator (FD-SOI) transistor, NVM transistor, capacitor, diode or any other integrated circuit component.

Figure 4:
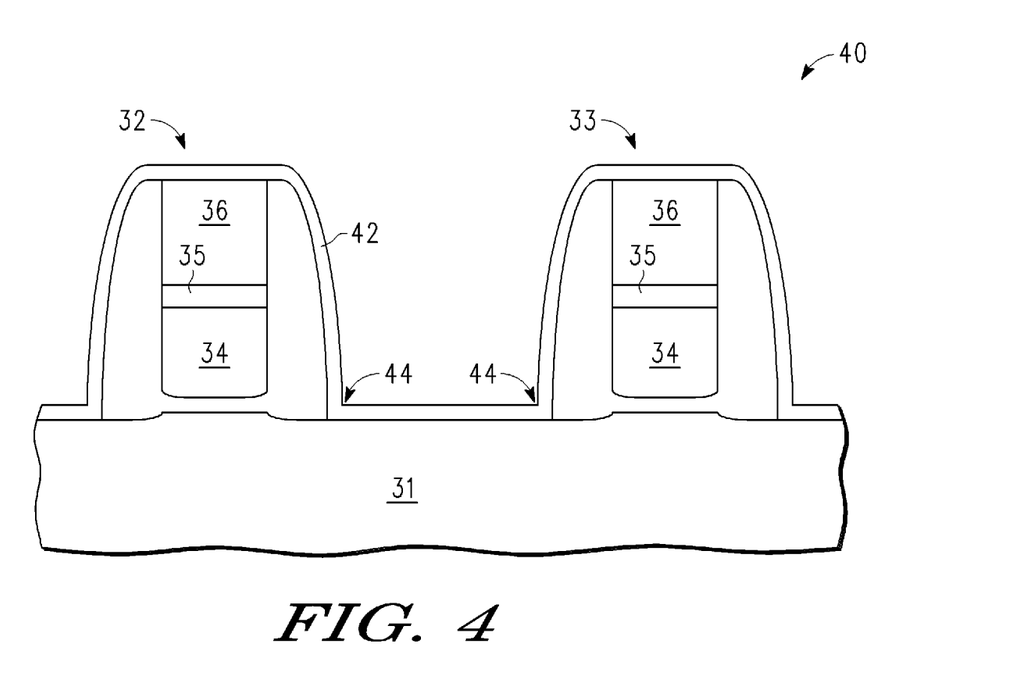
FIG. 4 illustrates processing subsequent to FIG. 3 after deposition of an etch stop layer.

FIG. 4 illustrates processing of a semiconductor device 40 subsequent to FIG. 3 after deposition of an etch stop layer 42 which may be formed by depositing silicon nitride to serve as a first mobile ion barrier layer. Any desired material may be used to form the etch stop layer 42, so long as the material protects the underlying device components 32, 33 from etch and/or ash damage when the contact holes are opened. In accordance with various embodiments, the etch stop layer 42 may be formed by depositing a layer of plasma-enhanced silicon nitride (SiN) or silicon carbonitride (SiCN) using chemical vapor deposition (CVD), plasma-enhanced chemical vapor deposition (PECVD), physical vapor deposition (PVD), atomic layer deposition (ALD) or any combination thereof. In a selected embodiment, the etch stop layer 42 is formed by depositing plasma-enhanced silicon nitride to a thickness of approximately 20-50 nanometers, though other thicknesses may also be used. Thus formed, the etch stop layer 42 protects the underlying devices 32, 33 during subsequent contact etch process(es) and also provides protection against mobile ions, to the extent that silicon nitride acts as a barrier to mobile ions. However, to the extent that mobile ions are able to penetrate the silicon nitride etch stop layer at the seam lines 44, the silicon nitride layer 42 provides only part of the gettering protection function for the devices 32, 33.

Figure 5:
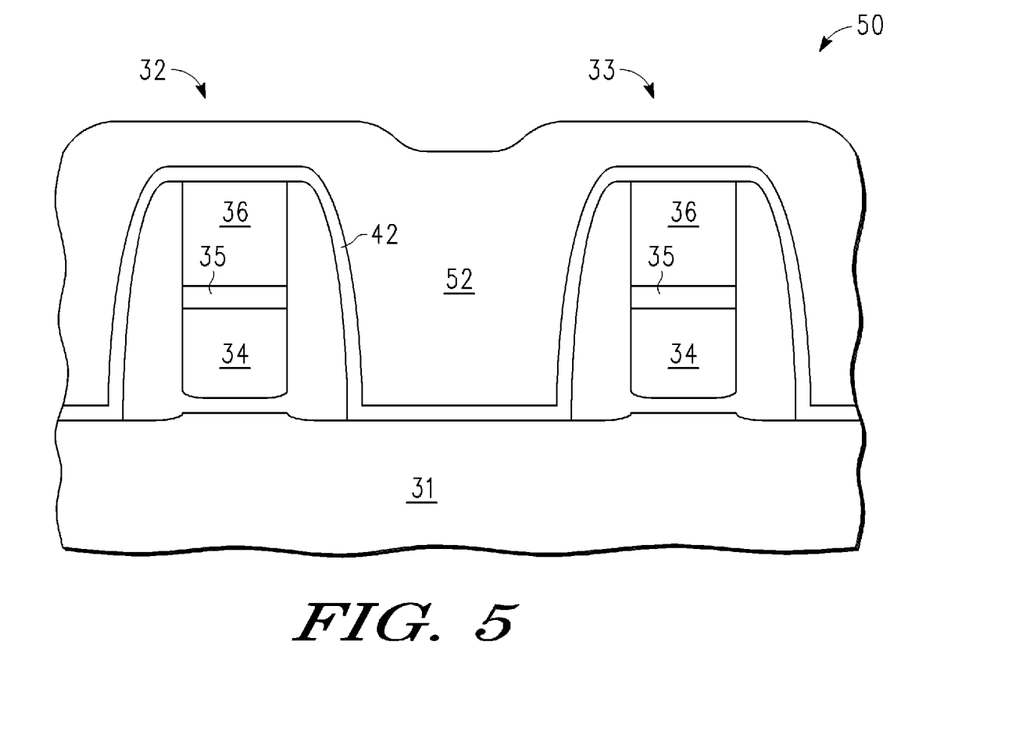
FIG. 5 illustrates processing subsequent to FIG. 4 after deposition of a gap fill layer formed with one or more dielectric film layers.

FIG. 5 illustrates processing of a semiconductor device 50 subsequent to FIG. 4 after deposition of a gap fill layer 52 over the etch stop layer 42. The deposited gap fill layer 52 forms at least part of a first interlayer dielectric stack that electrically isolates the device components 32, 33 formed on the substrate 31 from one another. As described herein, the first interlayer dielectric stack (ILD0) is formed with one or more dielectric pre-metal inter-level dielectric layers, including a gap fill layer 52 formed over the device components 32, 33 to a thickness of approximately 500-10000 Angstroms, though other thicknesses may also be used. Any desired dielectric material may be used to form the gap fill layer 52, though in accordance with various embodiments, the gap fill layer 52 is formed by depositing a conformal layer of silicon dioxide or other dielectric material using CVD, PECVD, PVD, ALD or any combination thereof. In selected embodiments, the material used to form the gap fill layer 52 is chosen to completely fill in the high aspect ratio regions between device components 32, 33 (such as are present particularly with NVM arrays) so that voids and metal stringer shorts (described above) are not formed. In addition to reducing or eliminating the substantial topographical variations or gap aspect ratio issues over the device components, the deposited gap fill layer 52 can be planarized to form an ILD0 base layer on which one or more gettering dielectric layers (e.g., a BPTEOS layer) may be formed, as described hereinbelow. In a selected embodiment, the gap fill layer 52 is formed by depositing sub-atmospheric tetra-ethyl ortho-silicate (SATEOS) to a thickness of at least approximately 1000-4000 Angstroms, which is sufficient to fill in the regions between device components, though other thicknesses may also be used. In addition or in the alternative, the gap fill layer 52 may be formed with low-pressure TEOS (LPTEOS) CVD, plasma-enhanced TEOS (PETEOS), CVD and/or $SiO_xN_y$, atmospheric pressure TEOS (APTEOS) CVD, HDP BPTEOS or HDP plasma enhanced PTEOS. At this point, the gap fill layer 52 may be densified with one or more anneal process steps, though it will be appreciated that an anneal process may also be applied subsequently in the fabrication process. Though not shown, a stable polish layer may be formed over the gap fill 52 using an appropriate dielectric material, such as PETEOS. However formed, the gap fill layer 52 forms an ILD0 base layer that substantially fills in the regions between devices components 32, 33, thereby reducing or eliminating the formation of voids or cores. In addition or in the alternative, the gap fill layer 52 is deposited to a sufficient thickness that a subsequent polish step will create a substantially planar surface on which a gettering layer of BPTEOS, BTEOS and/or PTEOS material may be formed.

Figure 6:
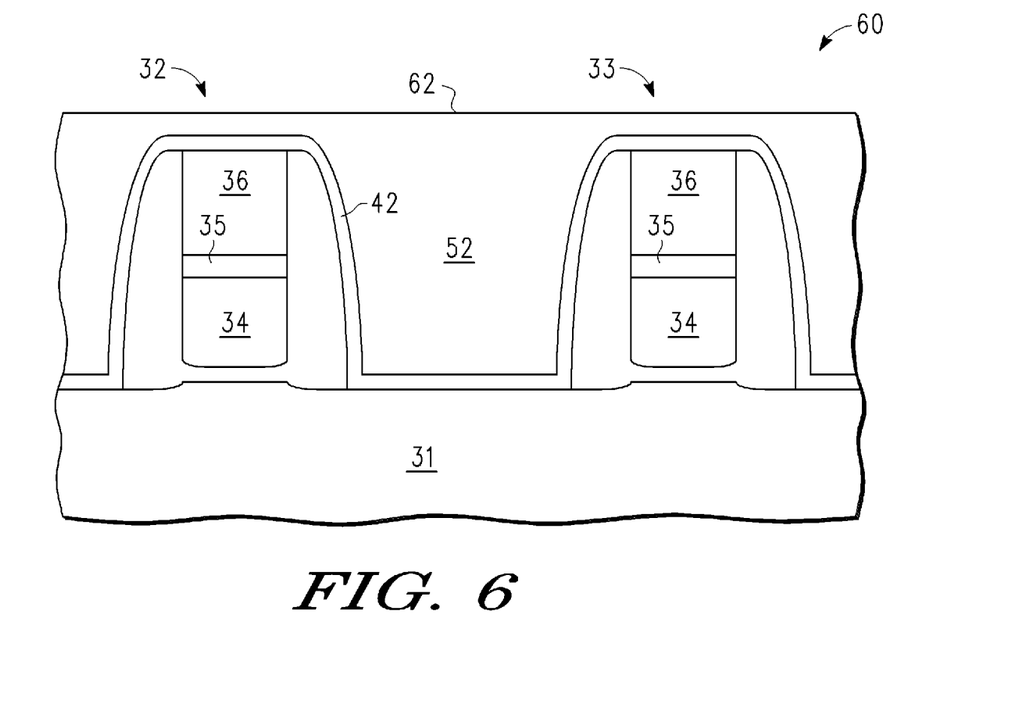
FIG. 6 illustrates processing subsequent to FIG. 5 after the gap fill layer is planarized with a chemical mechanical polish step.

FIG. 6 illustrates processing of a semiconductor device 60 subsequent to FIG. 5 after the gap fill layer 52 is planarized. While any desired planarization process may be used, in accordance with various embodiments, the gap fill layer 52 is planarized with an ILD0 planarization process that uses a chemical mechanical polish step to form a substantially planar surface 62 on the gap fill layer 52. By using a timed CMP process, the material from the upper region of the gap fill layer 52 is removed without also removing or exposing the etch stop layer 42.

Figure 7:
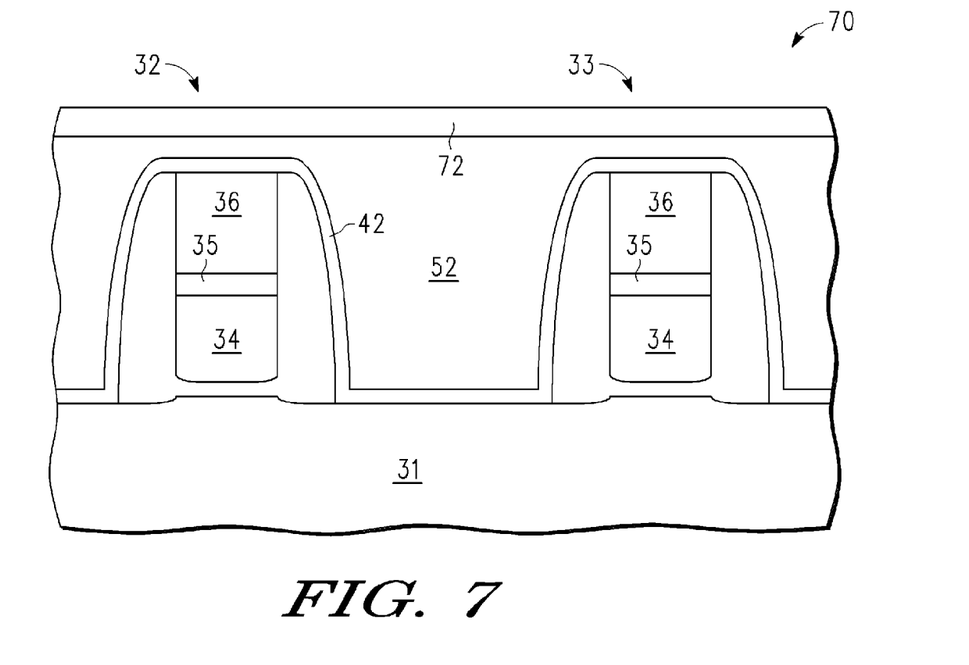
FIG. 7 illustrates processing subsequent to FIG. 6 after deposition of a first gettering dielectric layer.

FIG. 7 illustrates processing of a semiconductor device 70 subsequent to FIG. 6 after deposition of a first gettering dielectric layer 72. Any desired material may also be used to form the gettering dielectric layer 72, so long as the material protects the underlying layers from mobile ions. In accordance with various embodiments, the gettering dielectric layer 72 may be formed by depositing a layer of BPTEOS, PTEOS, BTEOS or a combination thereof using CVD, PECVD, PVD, ALD or any combination thereof. In a selected embodiment, the gettering dielectric layer 72 is formed by depositing BPTEOS to a thickness of approximately 10-100 nanometers, and more preferably 20-50 nanometers, though other thicknesses may also be used. Because the BPTEOS layer 72 can trap mobile ions, the gettering dielectric layer 72 effectively acts as a getter to mobile ions which can affect the performance of devices, such as NVM memories. At this point, the gettering dielectric layer 72 may be densified with one or more anneal process steps, though it will be appreciated that an anneal process may also be applied subsequently in the fabrication process. Thus formed, the gettering dielectric layer 72 protects the underlying devices 32, 33 against mobile ions. In particular, by depositing the gettering film layer 72 after the ILD0 planarization step, the gettering film layer 72 is formed as a continuous layer that is more effective in gettering mobile ions. Also, the interface between the gap fill material and the gettering material is improved. In addition, even when the ILD0 planarization step over polishes the ILD0 stack (and in particular, the gap fill layer 52), the disclosed methodology produces an intact and continuous layer of gettering material.

Figure 8:
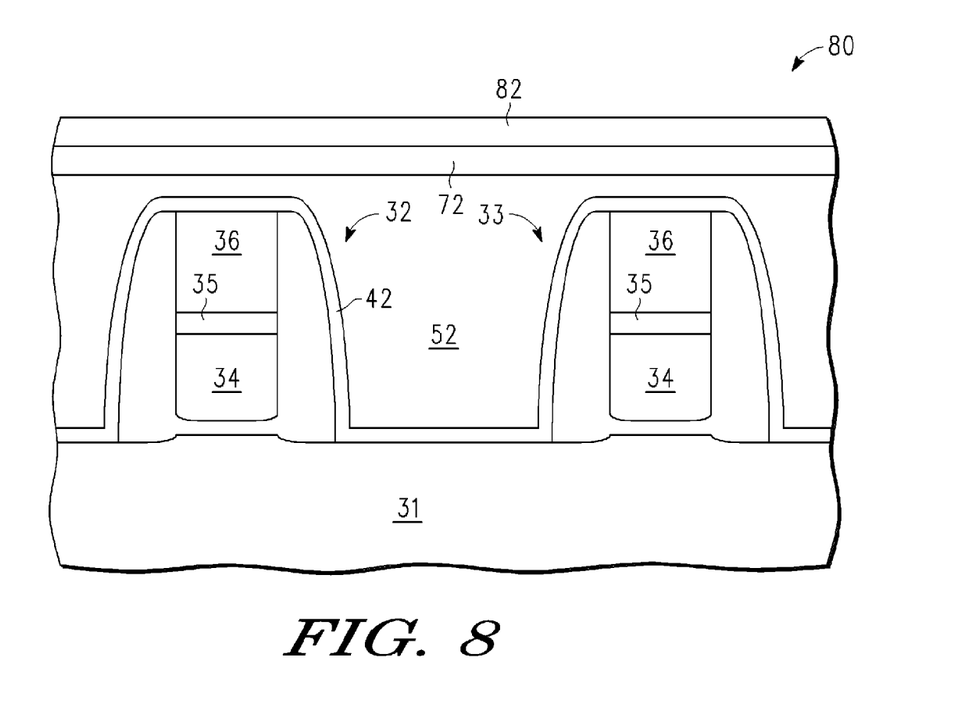
FIG. 8 illustrates processing subsequent to FIG. 7 after deposition of a second dielectric layer.

FIG. 8 illustrates processing of a semiconductor device 80 subsequent to FIG. 7 after deposition of a second or capping dielectric layer 82. While any desired material may be used to form the capping dielectric layer 82, various embodiments of the present invention form the capping dielectric layer 82 by depositing a layer of TEOS using CVD, PECVD, PVD, ALD or any combination thereof. In a selected embodiment, the additional capping dielectric layer 82 is formed by depositing PETEOS to a thickness of approximately 500-5000 Angstroms, and more preferably 1000 Angstroms, though other thicknesses may also be used. When formed with a dense dielectric layer, such as TEOS, the additional dielectric layer 82 provides structural support to anchor subsequently formed metal contact regions, and may also provide a copper diffusion barrier function to prevent subsequently formed copper from diffusing through the lower ILD0 layer(s). In addition, this TEOS cap protects the gettering film from exposure to the atmosphere where it can be exposed to other impurities which could reduce its efficiency as a gettering material.

Figure 9:
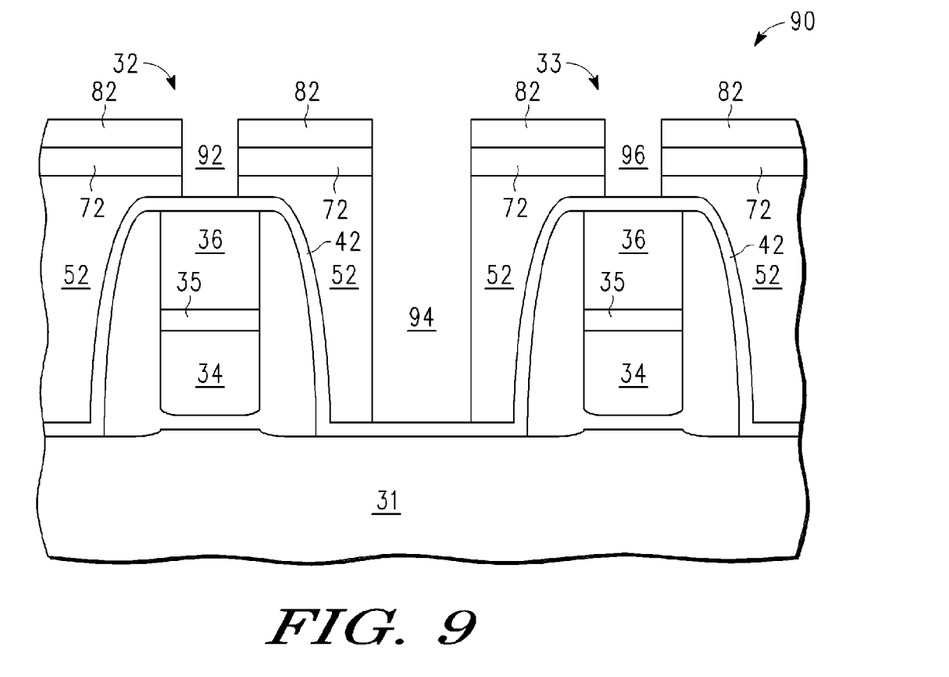
FIG. 9 illustrates processing subsequent to FIG. 8 after a contact opening is formed to exposed one or more device components.

FIG. 9 illustrates processing of a semiconductor device 90 subsequent to FIG. 8 after one or more contact openings 92, 94, 96 are formed to exposed one or more device components. As illustrated, each contact opening 92, 94, 96 is etched through the ILD0 stack to expose the etch stop layer 42 over an intended contact region of an underlying device component, such as a source/drain region (not shown) formed in a substrate 31 or a gate electrode on the device component 32, 33. For current state-of-the-art circuit designs, the contact opening 94 over the source/drain region has a width of approximately 500-3000 Angstroms, more preferably less than approximately 2000 Angstroms. With typical ILD0 stacks having a height in the regions between device components 32, 33 of approximately 3000-8000 Angstroms, more preferably approximately 5000 Angstroms, the result aspect ratio (height:width) for such devices is greater than about 1.5 to more than 4:1, though aspect ratios in future generation process technologies will be still higher. Any desired photolithography and/or selective etch techniques can be used to form the contact opening 92, 94, 96. For example, the contact opening 94 may be formed by depositing and patterning a protective mask or photoresist layer over the gettering dielectric layer 72 and/or additional dielectric layer 82 in which a contact hole is defined (not shown), and then anisotropic etching (e.g., reactive ion etching) the exposed ILD0 stack to form the contact opening 94. In another embodiment, a three stage etch process is used which removes selected portions of the second dielectric layer 82, the gettering layer 72, and the gap fill layer 52 before reaching the etch stop layer 42 formed over a selected contact region (and/or gate electrode). As a preliminary step, a layer of photoresist (not shown) may be applied and patterned directly on the second dielectric layer 82, though multi-layer masking techniques may also be used to define the locations of the contact openings 92, 94, 96. The exposed portions of the second dielectric layer 82, gettering dielectric layer 72 and gap fill layer 52 are then removed by using the appropriate etchant processes to etch the contact openings 92, 94, 96, such as an anisotropic reactive ion etching (RIE) process using $O_2$, $N_2$, or a fluorine-containing gas. For example, one or more etch processes that are selective for the dielectric materials in the ILD0 stack layers 82, 72, 52 (such as an Argon, $CHF_3$, or $CF_4$ chemistry that is used to etch carbon-doped oxide film) are used to etch through to the exposed portion of the etch stop layer 42. One or more additional etch and/or ash processes may be used to remove any remaining layers.

Though FIGS. 7-9 depict selected embodiments where a gettering film layer 72 and anchor layer 82 are formed over the polished gap fill layer 52, these layers may be replaced with a single PTEOS layer (not shown) formed over the planarized gap fill layer 52. In accordance with various embodiments, the single PTEOS layer is formed by depositing a conformal layer of phosphorus doped TEOS using CVD, PECVD, PVD, ALD or any combination thereof Because of the relative density of such a PTEOS layer, it can provide both the gettering and anchoring functions to anchor subsequently formed metal contacts.

As will be appreciated, additional processing steps may be used to complete the fabrication of the semiconductor device 90 into a functioning NVM device. In addition to various front end processing steps (such as sacrificial oxide formation, stripping, isolation region formation, gate electrode formation, extension implant, halo implant, spacer formation, source/drain implant, annealing, silicide formation, and polishing steps), additional backend processing steps may be performed, such as forming contact plugs and multiple levels of interconnect(s) that are used to connect the device components in a desired manner to achieve the desired functionality. Thus, the specific sequence of steps used to complete the fabrication of the device components may vary, depending on the process and/or design requirements.

Figure 10:
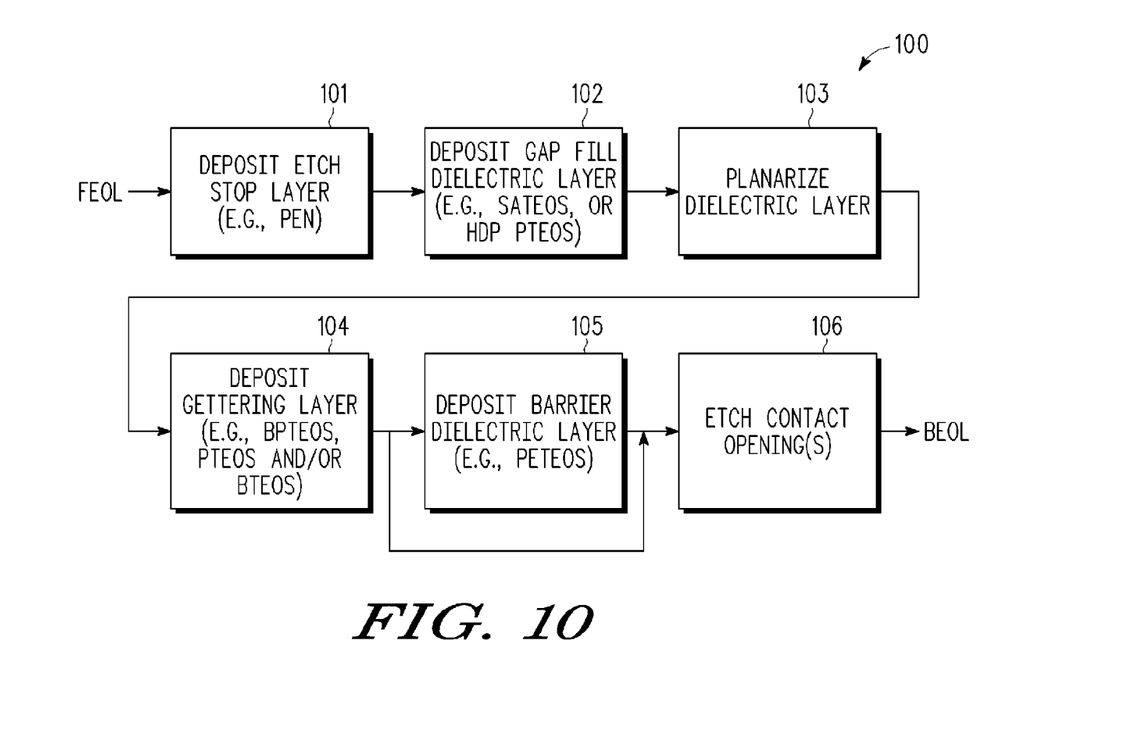
FIG. 10 is a flow diagram illustrating a process for forming an ILD0 stack having a gettering layer with substantially uniform thickness.

FIG. 10 is a flow diagram illustrating an example process 100 for forming an ILD0 stack having a gettering layer with substantially uniform thickness. As shown, the process picks up after the front end of line (FEOL) process and begins by forming an etch stop layer (step 101), such as by depositing a plasma enhanced nitride etch stop layer (PEN ESL). Next, an ILD0 stack is formed by depositing a gap fill dielectric layer (such as SATEOS, HDP PTEOS, etc.) at step 102. At this point, a CMP cap layer may also be deposited. Subsequently, the gap fill dielectric layer is planarized (e.g., with a CMP process) at step 103, a gettering layer (such as BPTEOS) is deposited at step 104, and a barrier dielectric layer (such as PETEOS) is deposited at step 105. However, as indicated by the bypass line between step 104 and step 106, the barrier dielectric deposition step may be skipped. Once the ILD0 stack is formed, one or more contact openings are etched through the ILD0 stack (step 106), thereby exposing the etch stop layer over the intended contact region, after which standard BEOL processing may be used to complete the device.

By now it should be appreciated that there has been provided a method for forming a first inter-layer dielectric stack on a semiconductor structure. In one form, the first inter-layer dielectric stack is formed by first forming an etch stop layer (e.g., with deposited plasma-enhanced nitride) over a plurality of device components, such as NVM transistor devices, that are formed on a semiconductor structure. Subsequently, a dielectric gap fill layer is formed over the etch stop layer (such as by depositing a SATEOS or HDP PTEOS layer) to fill in regions between the device components. The dielectric gap file layer is then planarized (e.g., with a CMP process) down to a substantially planar surface. Prior to the planarization step, a stable polish cap layer may be formed over the dielectric gap fill layer such that the stable polish cap layer and dielectric gap fill layer are planarized while planarizing the dielectric gap fill layer. On the substantially planar surface, a dielectric gettering layer is formed, such as by depositing a BPTEOS, BTEOS or PTEOS layer or combination thereof. In addition, a dielectric capping layer (e.g., PETEOS) may be formed over the dielectric gettering layer. Once the first inter-layer dielectric stack (ILD0) is formed, the dielectric gettering layer and the dielectric gap fill layer are selectively etched to expose the etch stop layer over one or more contact regions in one or more device components, and then the exposed etch stop layer is selectively etched to expose the contact regions.

In another form, there is provided a method and system for manufacturing a semiconductor device on which are formed a plurality of device components. As disclosed, a gap fill layer is formed by depositing a dielectric layer over the plurality of device components to fill in regions between the plurality of device components. To protect the device components, an etch stop layer may be formed over the plurality of device components prior to forming the gap fill layer. The gap fill layer may be formed in part by depositing a SATEOS or HDP doped TEOS layer over the plurality of device components to fill in regions between the plurality of device components, and may also include a deposited stable polish cap layer over the dielectric layer. After the gap fill layer is polished down to a substantially planar surface (e.g., by planarizing the gap fill layer with a chemical mechanical polish process), a gettering layer is deposited over the substantially planar surface of the gap fill layer. The gettering layer may be formed in part by depositing a BPTEOS layer, PTEOS layer or BTEOS layer or a combination thereof over the substantially planar surface of the gap fill layer. For example, the gettering layer may be formed by depositing one or more doped TEOS layers over the substantially planar surface of the gap fill layer, and then depositing an anchor layer formed from TEOS or plasma enhanced TEOS over the one or more doped TEOS layers. As formed, the gettering layer and the gap fill layer dielectric layer may be selectively etched to expose one or more contact regions in one or more device components.

In yet another form, there is provided a method and system for forming a first inter-layer dielectric stack by first forming a planarized gap fill layer over a plurality of device components to cover the plurality of device components and to fill in regions between the plurality of device components. In selected embodiments, the planarized gap fill layer may be formed by depositing a SATEOS or HDP doped TEOS layer over the plurality of device components to fill in regions between the plurality of device components, and then polishing the SATEOS or HDP doped TEOS layer down to a substantially planar surface. Over the planarized gap fill layer, one or more gettering layers are deposited so that an opening can be selectively etched in the one or more gettering layers and planarized gap fill layer to expose one or more contact regions in one or more device components. In selected embodiments, the gettering layers are formed by depositing one or more doped TEOS layers over the planarized gap fill layer, and then depositing an anchor layer formed from TEOS or plasma enhanced TEOS over the one or more doped TEOS layers.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. For example, selected embodiments of the present invention may be used to fill gaps between features of high aspect ratio (height to spacing) and provide contamination protection, and are not limited to MOSFET, DRAM, NVM or bipolar devices, but can be used with any type of semiconductor device. Thus, the particular embodiments disclosed above are illustrative only and should not be taken as limitations upon the present invention, as the invention may be modified and practiced in different but equivalent manners apparent to those skilled in the art having the benefit of the teachings herein. For example, the methodology of the present invention may be applied using materials other than expressly set forth herein. In addition, the invention is not limited to any particular type of integrated circuit described herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of forming a first inter-layer dielectric on a semiconductor structure, comprising:
    forming a plurality of device components comprising transistors with one or more contact regions on the semiconductor structure;
    forming an etch stop layer over the plurality of device components;
    forming a dielectric gap fill layer of undoped dielectric material over the etch stop layer to fill in regions between the transistors;
    applying a chemical mechanical polish process to planarize the dielectric gap fill layer down to a substantially planar surface;
    forming a dielectric gettering layer over the substantially planar surface of the dielectric gap fill layer by depositing a BPTEOS layer, PTEOS layer or BTEOS layer or a combination thereof to provide a mobile ion barrier layer which actively performs a gettering function; and
    selectively etching the dielectric gettering layer and the dielectric gap fill layer to expose the etch stop layer over one or more contact regions in one or more device components.

2. The method of claim 1, where forming an etch stop layer comprises depositing a layer of plasma-enhanced nitride over the plurality of device components.

3. The method of claim 1, where forming a dielectric gap fill layer comprises depositing a layer of silicon oxide, sub-atmospheric tetra-ethyl ortho-silicate (SATEOS), low-pressure TEOS (LPTEOS), plasma-enhanced TEOS (PETEOS), $SiO_x N_y$, atmospheric pressure TEOS (APTEOS), or high density plasma (HDP) oxide to fill in regions between the plurality of device components.

4. The method of claim 1, further comprising forming a dielectric capping layer over the dielectric gettering layer prior to selectively etching the dielectric gettering layer.

5. The method of claim 4, where forming a dielectric capping layer comprises depositing a plasma enhanced tetraethyl orthosilicate (PETEOS) layer over the dielectric gettering layer.

6. The method of claim 1, further comprising selectively etching the exposed etch stop layer to expose one or more contact regions in one or more device components.

7. The method of claim 1, further comprising forming a stable polish cap layer over the dielectric gap fill layer such that the stable polish cap layer and dielectric gap fill layer are planarized while planarizing the dielectric gap fill layer.

8. A method of manufacturing a semiconductor device, comprising:
    forming a plurality of transistors on a semiconductor substrate;
    forming a gap fill layer by depositing an undoped dielectric layer over the plurality of transistors to fill in regions between the plurality of transistors;
    polishing the gap fill layer down to a substantially planar surface by planarizing the gap fill layer with a chemical mechanical polish process; and
    depositing a gettering layer over the substantially planar surface of the gap fill layer which actively performs a gettering function.

9. The method of claim 8, where forming a gap fill layer comprises forming a stable polish cap layer over the undoped dielectric layer.

10. The method of claim 8, where forming a gap fill layer comprises depositing an undoped SATEOS or HDP TEOS layer over the plurality of transistors to fill in regions between the plurality of transistors.

11. The method of claim 8, where depositing a gettering layer comprises depositing a BPTEOS layer, PTEOS layer or BTEOS layer or a combination thereof over the substantially planar surface of the gap fill layer.

12. The method of claim 8, where depositing a gettering layer comprises:
   depositing one or more doped TEOS layers over the substantially planar surface of the gap fill layer; and
   depositing an anchor layer formed from TEOS or plasma enhanced TEOS over the one or more doped TEOS layers.

13. The method of claim 8, further comprising forming an etch stop layer over the plurality of transistors prior to forming the gap fill layer.

14. The method of claim 8, further comprising selectively etching the gettering layer and the gap fill layer dielectric layer to expose one or more contact regions in one or more transistors.

15. A method of forming a first inter-layer dielectric stack, comprising:
   forming a planarized gap fill layer of undoped dielectric material over a plurality of transistor devices to cover the plurality of transistor devices and to fill in regions between the plurality of transistor devices; then
   depositing a doped TEOS gettering layer to provide a mobile ion barrier layer over the planarized gap fill layer which actively performs a gettering function; then
   selectively etching an opening in the doped TEOS gettering layer and planarized gap fill layer to expose one or more contact regions in one or more transistor devices.

16. The method of claim 15, where forming a planarized gap fill layer comprises:
   depositing an undoped SATEOS or HDP TEOS layer over the plurality of transistor devices to fill in regions between the plurality of transistor devices; and
   polishing the SATEOS or HDP TEOS layer down to a substantially planar surface.

17. The method of claim 15, further comprising:
   depositing an anchor layer formed from TEOS or plasma enhanced TEOS over the doped TEOS gettering layer to anchor subsequently formed metal contact regions and to provide a copper diffusion barrier function to prevent subsequently formed copper from diffusing through to the doped TEOS gettering layer.

\* \* \* \* \*